United States Patent [19]
Chang et al.

[11] Patent Number: 5,691,213
[45] Date of Patent: Nov. 25, 1997

[54] LOW CAPACITANCE INPUT/OUTPUT INTEGRATED CIRCUIT

[75] Inventors: Ming-Chien Chang; Hong-Hsiang Tsai, both of Hsinchu, Taiwan

[73] Assignee: Vanguard International Semiconductor Corporation, Hsin-Chu, Taiwan

[21] Appl. No.: 529,002

[22] Filed: Sep. 15, 1995

[51] Int. Cl.$^6$ ................................................ H01L 21/265
[52] U.S. Cl. ........................ 437/27; 437/29; 437/40; 437/44
[58] Field of Search ................... 437/40, 27, 29, 437/44, 45; 257/360

[56] References Cited

U.S. PATENT DOCUMENTS 5,173,755  12/1992  Co et al. ............................ 257/360
5,182,220  1/1993   Ker et al. ............................ 437/34

*Primary Examiner*—Trung Dang
*Attorney, Agent, or Firm*—George O. Saile; Stephen B. Ackerman; Alek P. Szecsy

[57] ABSTRACT

A low capacitance input/output integrated circuit and a method by which the low capacitance input/output integrated circuit is formed. Formed upon a semiconductor substrate is an input/output integrated circuit which contains a minimum of one integrated circuit device. The integrated circuit device, in turn, possesses at minimum a source electrode and a drain electrode of the same polarity. Coincident with the source electrode and the drain electrode are normally at least one ion implant of polarity opposite to the source electrode and the drain electrode. At least a portion of the drain electrode is masked when the ion implant(s) of polarity opposite to the source electrode and the drain electrode are provided into the source electrode region and the drain electrode region of the integrated circuit device(s).

11 Claims, 3 Drawing Sheets

5,691,213

LOW CAPACITANCE INPUT/OUTPUT INTEGRATED CIRCUIT

BACKGROUND OF THE INVENTION

1. Field of the Invention

The present invention relates generally to low capacitance integrated circuits formed within and upon semiconductor substrates. More particularly, the present invention relates to low input capacitance input/output integrated circuits formed within and upon semiconductor substrates.

2. Description of Related Art

Integrated circuits are typically fabricated from semiconductor substrates within and upon whose surfaces are formed transistors, resistors, diodes, capacitors and other electrical circuit elements. These electrical circuit elements are connected internally and externally to the semiconductor substrate within and upon which they are formed through conductor metallization layers which are separated by insulating layers.

Electrical circuit elements may be arranged and connected within and upon semiconductor substrates in various fashions to accomplish diverse electrical functions. For example, within digital integrated circuit technology electrical circuit elements may be arranged to: (1) form charge storage locations for digital data input, and (2) form operational integrated circuits which perform mathematical functions upon digital data stored within those charge storage locations.

In order to effectively transfer electrical signals to charge storage locations or operational integrated circuits formed within and upon a semiconductor substrate it is common practice in the art to design and fabricate within and upon the semiconductor substrate input/output integrated circuits which provide electrical pathways through which electrical signals external to the semiconductor substrate must travel in order to reach the charge storage locations or operational integrated circuits within and upon the semiconductor substrate. These input/output integrated circuits are often designed and fabricated with Electro-Static Discharge (ESD) protection integrated sub-circuits within their constructions. The Electro-Static Discharge (ESD) protection integrated sub-circuits are designed to limit damage which might otherwise occur to the charge storage locations or operational integrated circuits through conduction and dissipation of unpredictable and uncontrollable Electro-Static Discharges (ESDs).

The Electro-Static Discharge (ESD) protection integrated sub-circuits and the input/output integrated circuits within which they reside are typically formed between the input/output terminal of the completed integrated circuit upon the semiconductor substrate, and the charge storage location or operational integrated circuit desired to be protected from Electro-Static Discharges (ESDs). The Electro-Static Discharge (ESD) protection integrated sub-circuits are typically fabricated from electrical circuit elements similar to the electrical circuit elements employed in forming the charge storage locations or operational integrated circuits which they protect. Typically, these electrical circuit elements will include transistors and resistors as are common in the art.

While Electro-Static Discharge (ESD) protection integrated sub-circuits and the input/output integrated circuits within which they reside usually provide the desired level of protection and access to the charge storage locations and operational integrated circuits to which they are connected, Electro-Static Discharge (ESD) protection integrated sub-circuits and input/output integrated circuits within which they reside are often not without negative characteristics. Specifically, input/output integrated circuits and Electro-Static Discharge (ESD) protection integrated sub-circuits within those input/output integrated circuits often add substantial input capacitance to the charge storage locations and operational integrated circuits to which they are connected. This input capacitance often derives from capacitances of junctions within electrical circuit elements from which are formed input/output integrated circuits and Electro-Static Discharge (ESD) protection integrated sub-circuits. Substantial input capacitances are often undesirable in advanced integrated circuits since electrical circuit capacitances, in general, contribute to delays in integrated circuit switching speeds.

It is thus an object of the present invention to provide an Electro-Static Discharge (ESD) protection integrated sub-circuit within an input/output integrated circuit upon a semiconductor substrate, which Electro-Static Discharge (ESD) protection integrated sub-circuit and input/output integrated circuit have lower input capacitances in comparison with Electro-Static Discharge (ESD) protection integrated sub-circuits and input/output integrated circuits conventional to the art, while simultaneously maintaining the Electro-Static Discharge (ESD) properties of the Electro-Static Discharge (ESD) protection integrated sub-circuit within the input/output integrated circuit.

SUMMARY OF THE INVENTION

An object of the present invention is to provide an Electro-Static Discharge (ESD) protection integrated sub-circuit within an input/output integrated circuit upon a semiconductor substrate, which Electro-Static Discharge (ESD) protection integrated sub-circuit and input/output integrated circuit in which it resides have a reduced input capacitance in comparison with Electro-Static Discharge (ESD) protection integrated sub-circuits and input/output integrated circuits conventional to the art, while not compromising the Electro-Static Discharge (ESD) characteristics of the Electro-Static Discharge (ESD) protection integrated sub-circuit.

A second object of the present invention is to provide an Electro-Static Discharge (ESD) protection integrated sub-circuit and an input/output integrated circuit in accord with the first object of the present invention, which Electro-Static Discharge (ESD) protection integrated sub-circuit and input/output integrated circuit are also readily manufacturable.

A third object of the present invention is to provide an Electro-Static Discharge (ESD) protection integrated sub-circuit and an input/output integrated circuit in accord with the first object of the present invention and the second object of the present invention, which Electro-Static Discharge (ESD) protection integrated sub-circuit and input/output integrated circuit are also economical.

In accord with the objects of the present invention, a low input capacitance Electro-Static Discharge (ESD) protection integrated sub-circuit within an input/output integrated circuit formed upon a semiconductor substrate is described along with its method of fabrication. The method for forming the low input capacitance Electro-Static Discharge (ESD) protection integrated sub-circuit and the input/output integrated circuit of the present invention comprises forming upon a semiconductor substrate an Electro-Static Discharge (ESD) protection integrated sub-circuit and an input/output integrated circuit, the Electro-Static Discharge (ESD) protection integrated sub-circuit and/or the input/output integrated circuit having contained therein at least one integrated circuit device, which integrated circuit device has at minimum a source electrode and a drain electrode, the locations of both of which source electrode and drain electrode are normally exposed to a minimum of one ion implant of polarity opposite to the source electrode and the drain electrode. At least a part of the location of the drain electrode of the integrated circuit device is masked when there is provided into the integrated circuit device the minimum of one ion implant of polarity opposite to the source electrode and the drain electrode.

The method of the present invention provides an Electro-Static Discharge (ESD) protection integrated sub-circuit contained within an input/output integrated circuit, which Electro-Static Discharge (ESD) protection integrated sub-circuit and input/output integrated circuit possess reduced input capacitance in comparison with Electro-Static Discharge (ESD) protection integrated sub-circuits and input/output integrated circuits conventional to the art. By masking at least a part of the drain electrode(s) of the integrated circuit device(s) within the Electro-Static Discharge (ESD) protection integrated sub-circuit and/or input/output integrated circuit of the present invention, and implanting ions of polarity opposite to the source electrode(s) and drain electrode(s) only into areas other than the masked portions of the drain electrode(s), the Electro-Static Discharge (ESD) protection integrated sub-circuit and the input/output integrated circuit of the present invention possess fewer junctions which contribute to input capacitances of charge storage locations or operational integrated circuits to which the Electro-Static Discharge (ESD) protection integrated sub-circuits and input/output integrated circuits of the present invention are connected.

The input/output integrated circuit of the present invention is readily manufacturable. The input/output integrated circuit of the present invention is manufactured through masking at least a portion of the drain electrode(s) of integrated circuit device(s) within an Electro-Static Discharge (ESD) protection integrated sub-circuit and/or input/output integrated circuit of the present invention. The masking protects a portion of the drain electrode(s) from implanted dopant ions of polarity opposite to the polarity of the drain electrode(s), to which implanted dopant ions the portions of the drain electrode(s) would otherwise be exposed. The photolithographic methods and materials which are used to mask the portions of the drain electrode(s) of the integrated circuit device(s) of the present invention are well known in the art and readily manufacturable.

The integrated circuit formed through the method of the present invention is economical. The integrated circuit of the present invention is formed through masking portions of the drain electrode(s) of integrated circuit device(s) from multiple ion implants of polarity opposite to the polarity of the drain electrode(s) of the present invention, to which ion implants the portions of the drain electrode(s) of the present invention would otherwise be exposed. The masking operation is common to the art and the masking operation provides minimal additional expense to the manufacturing process of the input/output integrated circuit of the present invention.

BRIEF DESCRIPTION OF THE DRAWINGS

The accompanying drawings, which form a material part of this application, show the following.

DESCRIPTION OF THE PREFERRED EMBODIMENTS

Figure 1:
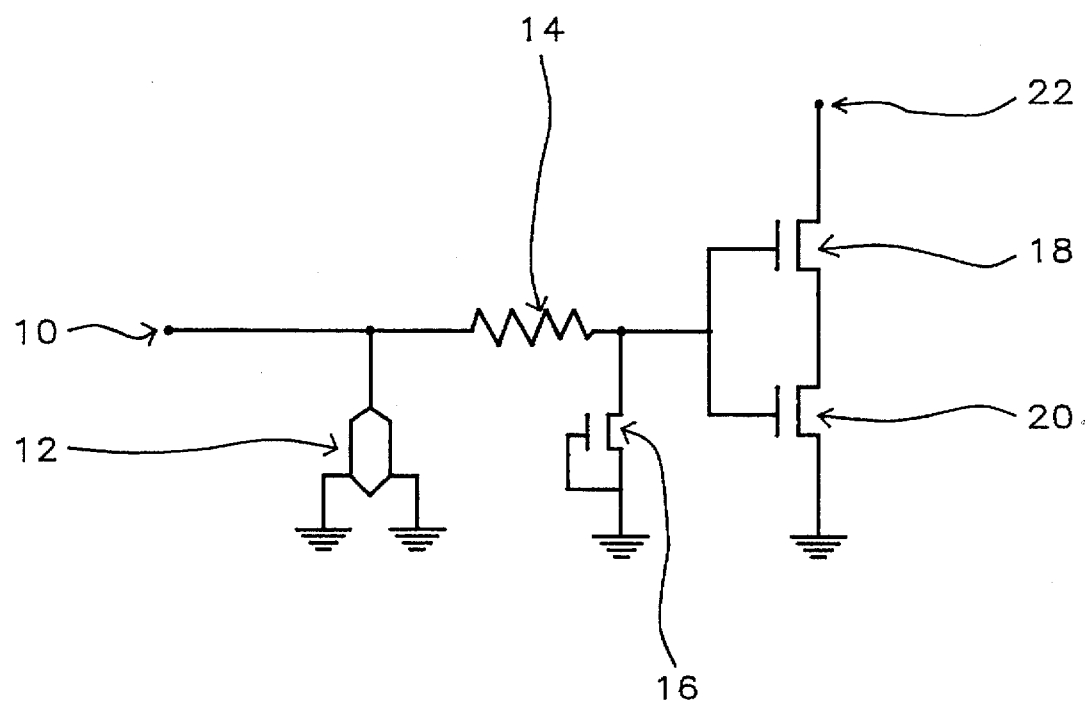
FIG. 1 shows a schematic diagram of an address input integrated circuit upon which the method of the present invention may be practiced.

The present invention provides an Electro-Static Discharge (ESD) integrated sub-circuit within an input/output integrated circuit upon a semiconductor substrate, which Electro-Static Discharge (ESD) protection integrated sub-circuit and input/output integrated circuit possess reduced input capacitance in comparison with Electro-Static Discharge (ESD) integrated sub-circuits and input/output integrated circuits conventional to the art. The reduced input capacitance is exhibited without compromising the Electro-Static Discharge (ESD) protection characteristics of the Electro-Static Discharge (ESD) protection integrated sub-circuit or the input/output integrated circuit.

The reduced input capacitance of the Electro-Static Discharge (ESD) protection integrated sub-circuit and input/output integrated circuit of the present invention is obtained by masking at least a portion of the locations of the drain electrode(s) of integrated circuit device(s) within the Electro-Static Discharge (ESD) protection integrated sub-circuit and/or input/output integrated circuit of the present invention from ion implants of polarity opposite to the polarity of those drain electrode(s), which ion implants would otherwise be provided into the locations of those drain electrode(s). Masking at least a portion of the locations of the drain electrode(s) of these integrated circuit devices from these ion implants provides substantial reductions of input capacitance to the Electro-Static Discharge (ESD) protection integrated sub-circuits and input/output integrated circuits within which those integrated circuit devices reside. The reduction of input capacitance within those Electro-Static Discharge (ESD) integrated sub-circuits and input/output integrated circuits typically provides for faster switching speed when accessing charge storage locations or operational integrated circuits to which those Electro-Static Discharge (ESD) protection integrated sub-circuits and input/output integrated circuits are connected.

The present invention may be employed in any Electro Static Discharge (ESD) protection integrated sub-circuit or input/output integrated circuit wherein there is needed the reduced input capacitance which the present invention provides, while simultaneously maintaining the Electro-Static Discharge (ESD) protection characteristics of the Electro-Static Discharge (ESD) protection integrated sub-circuit and input/output integrated circuit. The method of the present invention may be employed in forming Electro-Static Discharge (ESD) protection integrated sub-circuits and input/output integrated circuits within Dynamic Random Access Memory (DRAM) integrated circuits, Static Random Access Memory (SRAM) integrated circuits, Application Specific Integrated Circuits (ASICs), integrated circuits having within their fabrications field effect transistors and integrated circuits having within their fabrications other field effect integrated circuit devices which possess a minimum of one source electrode and one drain electrode. The method of the present invention has broad applicability within integrated circuits.

Referring now to FIG. 1, there is shown a schematic diagram of an Electro-Static Discharge (ESD) integrated sub-circuit applicable to input integrated circuits which are used to input addresses of charge storage locations upon semiconductor substrates. The circuit is commonly referred to as an address input integrated circuit. The circuit shown in FIG. 1 represents the first preferred embodiment upon which the method of the present invention may be practiced.

Shown in FIG. 1 is an input terminal 10 to which is connected a drain electrode of a field device 12 and a first electrode of a resistor 14. As will be illustrated in FIG. 2a and FIG. 2b, the field device 12 is a field effect integrated circuit device possessing one drain electrode and two source electrodes. To a second electrode of the resistor 14 is connected a drain electrode of a field effect transistor 16, a gate electrode of field effect transistor 18 and a gate electrode of field effect transistor 20. A source electrode of field effect transistor 18 is connected to a drain electrode of field effect transistor 20. A source electrode of the field device 12, a gate electrode of the field effect transistor 16, a source electrode of the field effect transistor 16 and a source electrode of the field effect transistor 20 are connected to ground. A remaining second source electrode of the field device 12 is also connected to ground. Finally, a drain electrode of field effect transistor 18 provides the output terminal 22 of the circuit.

The resistor and transistors from which is formed the circuit illustrated in FIG. 1 are common to the art. For the first preferred embodiment of the present invention, the resistor 14 is typically about 50 to about 100 ohms resistance. In addition, the field effect transistors 16, 18 and 20 illustrated in FIG. 1 may be formed from several permutations of transistor polarity (ie: n-p-n or p-n-p) and operational mode (ie: enhancement mode or depletion mode) as are known in the art. Characteristics of the field device 12 are discussed in greater detail through reference to FIG. 2a and FIG. 2b.

Figure 2A:
FIG. 2a and FIG. 2b show schematic cross-sectional diagrams of a field device formed within the address input integrated circuit of FIG. 1, upon which field device is practiced the method of the present invention.
Figure 2A:
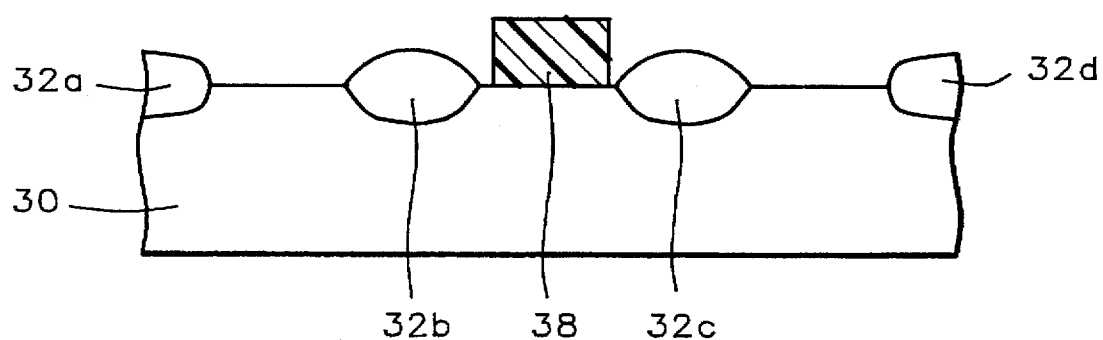
Figure 2B:
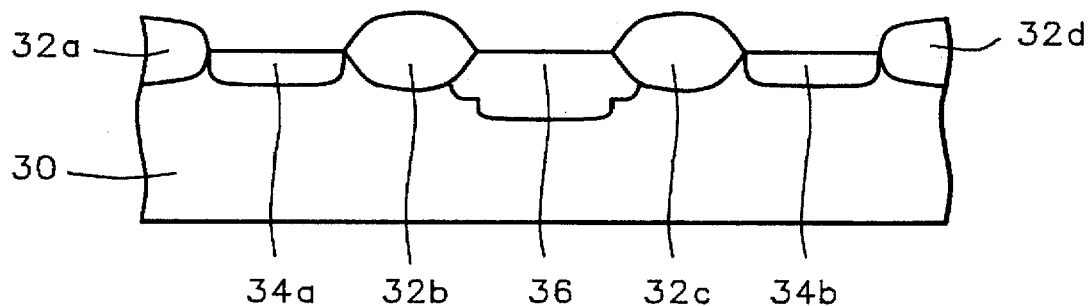

Shown in FIG. 2a and FIG. 2b are schematic cross-sectional diagrams of the field device 12 at progressive stages of processing in accord with the first preferred embodiment of the present invention. Shown in FIG. 2a is a schematic cross-sectional diagram of the field device 12 at the first stages of processing in accord with the first preferred embodiment of the present invention. Shown in FIG. 2a is a semiconductor substrate 30 upon whose surface is formed isolation regions 32a, 32b, 32c and 32d which define active regions of the semiconductor substrate 30. Although the present invention may be practiced upon semiconductor substrates of either dopant type, any dopant concentration and any crystallographic orientation, the first preferred embodiment of the present invention will typically be practiced upon a P-semiconductor substrate having a (100) crystallographic orientation.

In general, isolation regions within and/or upon semiconductor substrates may be formed through processes including but not limited to thermal oxidation processes whereby portions of a semiconductor substrate exposed through an appropriate mask are thermally oxidized at elevated temperatures, and processes whereby patterned layers of oxide isolation materials are independently formed upon surfaces of semiconductor substrates. For the first preferred embodiment of the present invention, the isolation regions 32a, 32b, 32c and 32d are preferably formed through a thermal oxidation (ie: field oxidation) process whereby portions of the semiconductor substrate 30 exposed through an appropriate mask are thermally oxidized at a temperature of about 950 to about 1100 degrees centigrade.

Also shown in FIG. 2a is the presence of a patterned masking layer 38 formed upon at least part of the surface of the semiconductor substrate 30 between the isolation regions 32b and 32c. The portion of the semiconductor substrate 30 between the isolation regions 32b and 32c forms the region of the drain electrode of the field device 12. The regions of the semiconductor substrate 30 between the isolation regions 32a and 32b and the isolation regions 32c and 32d form the regions of the two source electrodes of the field device 12.

Methods and materials through which selected portions of surfaces of semiconductor substrates may be masked are known in the art. Typically, these methods and materials include but are not limited to methods whereby blanket photoresist layers are coated upon the surface of a semiconductor substrate and patterned through photolithographic and etching methods as are conventional to the art to leave remaining selected portions of patterned photoresist layers which mask specific areas of the semiconductor substrate.

For the first preferred embodiment of the present invention, several types and thicknesses of photoresists may be employed to provide the patterned masking layer 38. The important feature of the patterned masking layer 38 is that the patterned masking layer 38 be of sufficient thickness and integrity to completely mask at least a portion of the underlying location of the drain electrode from the subsequent ion implant processes to which the underlying location of the drain electrode would otherwise be exposed.

Finally, there is also shown in FIG. 2a is the presence of implanting ions 40, which are implanted into areas of the semiconductor substrate 30 other than those occupied by the isolation regions 32a, 32b, 32c and 32d, and the patterned masking layer 38. In practice of the first preferred embodiment of the present invention, the low input capacitance Electro-Static Discharge (ESD) protection integrated sub-circuit within the input/output integrated circuit will only be formed when the implanting ions 40 are of a polarity opposite to the polarity of the subsequently formed source electrodes and the drain electrode of the field device 12.

In the practice of fabricating field effect integrated circuit devices which possess source electrodes and drain electrodes, there are often process flow sequences and integrated circuit device performance parameters which require implanting into the source electrodes and the drain electrodes of those field effect integrated circuit devices dopant ions of polarity opposite to the source electrodes and the drain electrodes. Such ion implant processes include but are not limited to: (1) threshold voltage ion implant processes by which the switching voltages of field effect integrated circuit devices may be adjusted, (2) punchthrough ion implant processes whereby junction depths of field effect integrated circuit devices may be adjusted, and (3) field ion implant processes (ie: channel stop ion implant processes) whereby adjoining field effect integrated circuit devices may be isolated from each other.

For the first preferred embodiment of the present invention, the implanting ions 40 which are implanted into areas of the semiconductor substrate 30 other than areas of the semiconductor substrate 30 beneath the isolation regions 32a, 32b, 32c and 32d, and the patterned masking layer 38 are preferably chosen from the group of implanting ions consisting of boron ions and boron difluoride ions. The boron and/or boron difluoride ions are preferably employed in threshold voltage ion implant processes, punchthrough ion implant processes and field ion implant processes (ie: channel stop ion implant processes). The boron and/or boron difluoride ion implants are preferably provided at a total ion implantation dose of about 5E11 to about 8E12 ions per square centimeter and an ion implantation energy of about 50 to about 180 keV.

In addition to masking at least a part of the location of the drain electrode of the field device illustrated in FIG. 2a, at least a part of the location of the drain electrode of the field effect transistor 16 illustrated in FIG. 1 may also preferably be similarly masked such that dopant ions of polarity opposite to the source/drain electrodes of that transistor may also be excluded from at least a portion of the drain electrode of that transistor.

Referring now to FIG. 2b, there is shown a cross-sectional schematic diagram of the field device 12 at a latter stage in its fabrication. Shown in FIG. 2b is the presence of source electrodes 34a and 34b between the pair of isolation regions 32a and 32b and the pair of isolation regions 32c and 32d, respectively. Also shown in FIG. 2b is the presence of a drain electrode 36 between the isolation regions 32b and 32c. The source electrodes 34a and 34b, and the drain electrode 36, form the three electrodes of the field device 12 formed in accord with the first preferred embodiment of the present invention.

In order to form the source electrodes 34a and 34b, and the drain electrode 36, the patterned masking layer 38 is first removed from the surface of the semiconductor substrate 30 through methods and materials as are conventional to the art. The source electrodes 34a and 34b, and the drain electrode 36, are then formed through methods analogous to the methods by which source/drain electrodes within field effect transistors are formed. Specifically, source/drain electrodes within field effect transistors are formed through methods including but not limited methods whereby dopant ions are accelerated and implanted into the surface of a semiconductor substrate. Dopant ions suitable for forming source/drain electrodes within field effect transistors include but are not limited to arsenic ions, boron ions, boron difluoride ions and phosphorus ions. For the first preferred embodiment of the present invention, the source electrodes 34a and 34b, and the drain electrode 36, of the field device are preferably formed through accelerating and implanting arsenic dopant ions into the semiconductor substrate 30 at an ion implantation dose of about 1E15 to about 6E15 arsenic ions per square centimeter and an ion implantation energy of about 30 to about 80 keV.

For the first preferred embodiment of the present invention, it is preferred that the source/drain electrodes of the field effect transistors 16, 18 and 20 are also formed by implanting arsenic ions at about 1E15 to about 6E15 ions per square centimeter dose and about 30 to about 80 keV ion implantation energy into the semiconductor substrate upon which those field effect transistors are formed. Further, it is also preferred for the first preferred embodiment of the present invention that at least a portion of the drain electrode of the field device 12 and at least a portion of the drain electrode of the field effect transistor 16 be simultaneously masked and areas other than the masked areas be simultaneously implanted with boron or boron difluoride ions at a total dose of about 5E11 to about 8E12 ions per square centimeter and an ion implantation energy of about 50 to about 180 keV. Preferably, the boron and/or boron difluoride dopant ions will be provided through threshold voltage ion implant processes, punchthrough ion implant processes and field ion implant processes (ie: channel stop ion implant processes).

Upon forming the source electrodes 34a and 34b and the drain electrode 36 into the surface of the semiconductor substrate 30, there is formed the field device 12 of the first preferred embodiment of the present invention. The field device 12 may then be connected with other electrical circuit elements of the Electro-Static Discharge (ESD) protection integrated sub-circuit and input/output integrated circuit of FIG. 1 through patterned metallization layers as are conventional in the art. Upon connecting these electrical circuit elements there is formed the low input capacitance Electro-Static Discharge (ESD) protection integrated sub-circuit and the input/output integrated circuit of the first preferred embodiment of the present invention.

Figure 3:
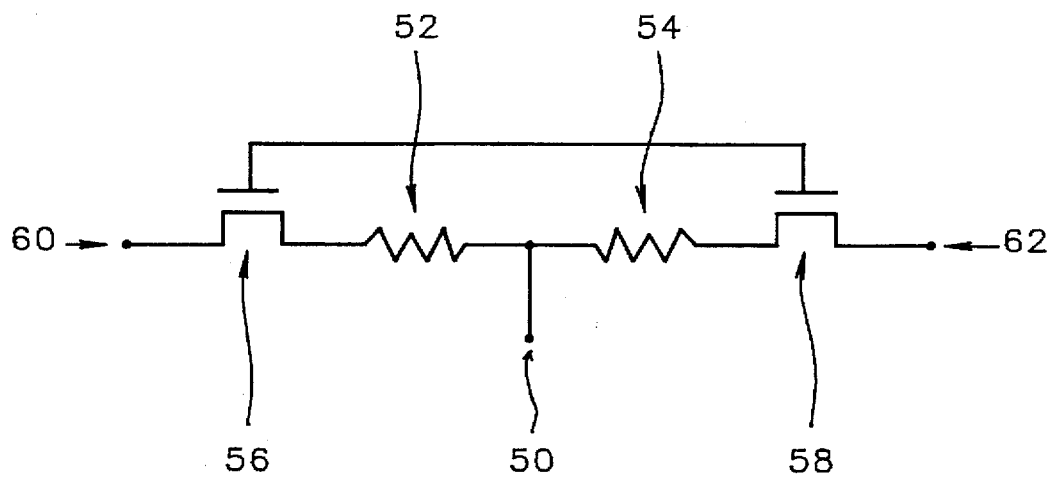
FIG. 3 shows a schematic diagram of a data output integrated circuit upon which the method of the present invention may be practiced.

Referring now to FIG. 3, there is shown a schematic diagram illustrating a second input/output integrated circuit upon which the method of the present invention may be practiced. The schematic diagram of FIG. 3 illustrates the electrical circuit components of a data input/output integrated circuit. Practice of the method of the present invention upon this input/output integrated circuit provides the second preferred embodiment of the present invention.

Shown in FIG. 3 is an input/output terminal 50 to which is connected a first end of a first resistor 52 and a first end of a second resistor 54. A second end of the first resistor 52 is connected to a drain electrode of a field effect transistor 56 and a second end of the second resistor 54 is connected to a source electrode of a field effect transistor 58. A gate electrode of the field effect transistor 56 and a gate electrode of the field effect transistor 58 are shunted together. A first circuit output 60 is obtained from a source electrode of the field effect transistor 56 and a second circuit output 62 is obtained from a drain electrode of the field effect transistor 58.

For the second preferred embodiment of the present invention, the first resistor 52 and the second resistor 54 are preferably about 3 to about 15 ohms each. Analogously to the first preferred embodiment of the present invention, the field effect transistors 56 and 58 upon which may be practiced the second preferred embodiment of the present invention may be of either polarity type (ie: n-p-n or p-n-p).and of either operational mode (ie: enhancement mode or depletion mode). For the second preferred embodiment of the present invention, the field effect transistors 56 and 58 are preferably n-p-n enhancement mode transistors.

Figure 4A:
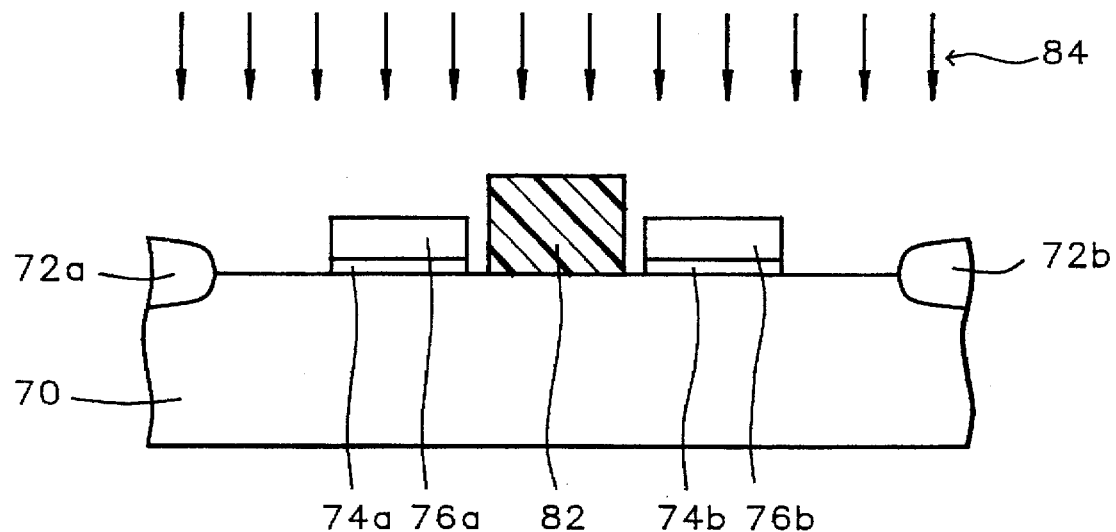
FIG. 4a and FIG. 4b show schematic cross-sectional diagrams of a pair of field effect transistors formed within the data output integrated circuit of FIG. 3, upon which field effect transistors is practiced the method of the present invention.
Figure 4B:
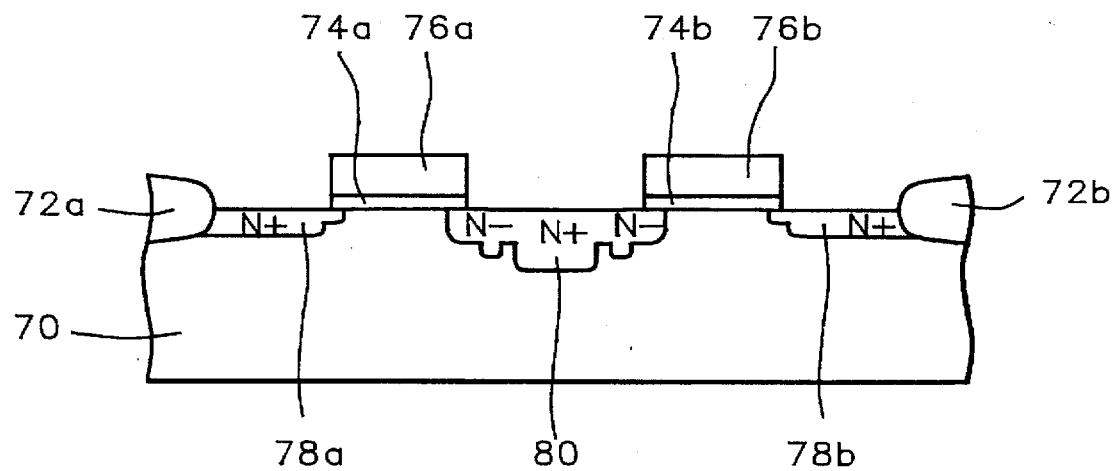

Referring now to FIG. 4a and FIG. 4b there is shown a pair of cross-sectional diagrams illustrating progressive stages in forming the field effect transistors 56 and 58 upon a semiconductor substrate in accord with the second preferred embodiment of the present invention. Shown in FIG. 4a is a semiconductor substrate 70 within and upon whose surface is formed isolation regions 72a and 72b which define the active region of the semiconductor substrate 70. The semiconductor substrate 70 is provided in accord with the same parameters by which is provided the semiconductor substrate 30 of the first preferred embodiment of the present invention. In addition, the isolation regions 72a and 72b are formed in a fashion analogous to the fashion by which the isolation regions 32a, 32b, 32c and 32d are formed in the first preferred embodiment of the present invention. Specifically, the isolation regions 72a and 72b are preferably formed through thermal oxidation of portions of the semiconductor substrate 70 exposed through a suitable mask.

There is also illustrated in FIG. 4a patterned gate oxide layers 74a and 74b which reside, respectively, beneath gate electrodes 76a and 76b. Methods and materials through which both patterned gate oxide layers and gate electrodes may be formed upon semiconductor substrates are known in the art. Patterned gate oxide layers may be formed through patterning blanket gate oxide layers formed upon active semiconductor substrate regions through methods including but not limited to methods whereby the surface of the active semiconductor region is oxidized to form a blanket gate oxide layer and methods whereby a blanket gate oxide layer is independently formed upon the surface of the semiconductor substrate. Gate electrodes are typically formed by patterning of blanket layers of gate electrode materials formed upon the surfaces of blanket gate oxide layers. Gate electrode materials include but are not limited to conducting materials such as metals, metal alloys and polysilicon. Gate electrode materials are formed upon the surface of a semiconductor substrate through methods including but not limited to evaporation methods, Chemical Vapor Deposition (CVD) methods and Physical Vapor Deposition (PVD) sputtering methods.

For the second preferred embodiment of the present invention, the gate oxide layers 74a and 74b are preferably formed from patterning through methods as are conventional in the art of a blanket layer of gate oxide material formed upon the active region of the semiconductor substrate 70 through a thermal oxidation process. The blanket layer of gate oxide material from which is patterned the gate oxide layers 74a and 74b is typically about 50 to about 350 angstroms thick. The gate electrodes 76a and 76b are preferably formed by patterning of a blanket layer of highly doped polysilicon formed upon the surface of the semiconductor substrate 70 through a Chemical Vapor Deposition (CVD) method employing disilane as the silicon source material. Preferably, the blanket layer of highly doped polysilicon is doped through implantation of suitable dopant ions at a dose of about 5E15 to about 2E16 dopant ions per square centimeter.

Also shown in FIG. 4a is the presence of a patterned masking layer 82 which covers the region of the drain electrode which will be shared by the two field effect transistors. Analogously to the first preferred embodiment of the present invention, the patterned masking layer 82 is preferably formed through patterning via photolithographic and etching methods as are common in the art of a blanket photoresist layer. The blanket photoresist layer is formed with a thickness and integrity sufficient to completely mask at least a portion of the region of the drain electrode within the semiconductor substrate 70 from the subsequent ion implant processes to which other regions of the semiconductor substrate 70 are subjected.

Finally, there is shown in FIG. 4a the presence of implanting ions 84, which are implanted into areas of the semiconductor substrate 70 other than those occupied by the isolation regions 72a and 72b, the gate electrodes 76a and 76b, the gate oxides 74a and 74b and the patterned masking layer 82. Analogously to the first preferred embodiment of the present invention, the low input capacitance Electro-Static Discharge (ESD) protection integrated sub-circuit within the input/output integrated circuit of the second preferred embodiment of the present invention will only be formed when the implanting ions 84 are of a polarity opposite to the polarity of the source electrodes and the drain electrode of two field effect transistors which will be formed in the surface of the semiconductor substrate 70.

Similarly to the first preferred embodiment of the present invention, in the practice of fabricating field effect transistors within integrated circuits there are often process flow sequences and field effect transistor performance parameters which require implanting into source and drain electrodes of those field effect transistors dopant ions of polarity opposite to the source electrodes and drain electrodes. Such ion implant processes include but are not limited to: (1) threshold voltage ion implant processes by which the switching voltages of field effect transistors may be adjusted, (2) punchthrough ion implant processes whereby junction depths within field effect transistors may be adjusted, and (3) field ion implant processes (ie: channel stop ion implant processes) whereby adjoining field effect transistors may be isolated from each other.

For the second preferred embodiment of the present invention, the implanting ions 84 to which the areas of the semiconductor substrate 70 other than those areas of the semiconductor substrate 70 occupied by the isolation regions 72a and 72b, the gate electrodes 76a and 76b, the gate oxides 74a and 74b and the patterned masking layer 82 are exposed are preferably chosen from the group of implanting ions consisting of boron ions and boron difluoride ions. The boron or boron difluoride ions are preferably employed in threshold voltage ion implant processes, punchthrough ion implant processes and field ion implant processes (ie: channel stop ion implant processes). The boron or boron difluoride ion implants are preferably provided at a total ion implantation dose of about 5E11 to about 8E12 ions per square centimeter and an ion implantation energy of about 50 to about 180 keV.

Referring now to FIG. 4b, there is shown a schematic cross-sectional diagram illustrating the field effect transistors of the second preferred embodiment of the present invention at a later stage of fabrication. Illustrated in FIG. 4b is the presence of the source electrodes 78a and 78b, and the drain electrode 80. Methods and materials through which are formed the source electrodes 78a and 78b, and the drain electrode 80, are also analogous to the first preferred embodiment of the present invention. First, the patterned masking layer 82 is removed from the surface of the semiconductor substrate 70 through methods as are conventional in the art. Next, the source electrodes 78a and 78b, and the drain electrode 80 are preferably formed within the semiconductor substrate 70 through an ion implantation process which employs arsenic dopant ions at an ion implantation dose of about 1E15 to about 6E15 ions per square centimeter and an ion implantation energy of about 30 to about 80 keV.

Upon forming the source electrodes 78a and 78b, and the drain electrode 80, the electrical circuit elements of the Electro-Static Discharge (ESD) protection integrated sub-circuit and input/output integrated circuit of FIG. 3 may be connected through patterned metallization layers as are conventional in the art. Upon connecting these electrical circuit elements there is formed the low input capacitance Electro-Static Discharge (ESD) protection integrated sub-circuit and the input/output integrated circuit of the second preferred embodiment of the present invention.

EXAMPLES 1-3

Two Dynamic Random Access Memory (DRAM) integrated circuit chips were fabricated upon a P- silicon semiconductor substrate having a (100) crystallographic orientation. Incorporated into their constructions were Electro-Static Discharge (ESD) protection integrated sub-circuits and input/output integrated circuits in accord with the first preferred embodiment of the present invention and the second preferred embodiment of the present invention. These Electro-Static Discharge (ESD) protection integrated sub-circuits and input/output integrated circuits included the address input integrated circuit illustrated in FIG. 1 and the data input/output integrated circuit illustrated in FIG. 3.

Within these two Dynamic Random Access Memory (DRAM) integrated circuit chips, all source and drain electrodes within field devices and field effect transistors within the Electro-Static Discharge (ESD) integrated sub-circuits and the input/output integrated circuits were formed through arsenic ion implantation processes at about 3E15 ions per square centimeter dose and about 40 keV ion implantation energy. Prior to forming the source electrodes and the drain electrodes through the arsenic ion implantation processes, portions of all of the drain electrode regions within the field devices and field effect transistors within those circuits were masked with patterned photoresist layers. After masking portions of the drain electrode regions, the unmasked areas were subjected to the following ion implant processes: (1) a threshold voltage ion implant process employing boron difluoride dopant ions at about 1.2E12 ions per square centimeter dose and about 50 keV ion implantation energy, (2) a punchthrough ion implant process employing boron dopant ions at about 1.6E12 ions per square centimeter dose and about 120 keV ion implantation energy, and (3) a field ion implant process (ie: a channel stop ion implant process) employing boron dopant ions at about 3E12 ions per square centimeter dose and about 180 keV ion implantation energy.

The patterned photoresist masking layers were then removed from the regions of the drain electrodes and the source/drain electrodes were formed within the semiconductor substrates through the above noted arsenic ion implantation process. The Electro-Static Discharge (ESD) protection integrated sub-circuits and input/output integrated circuits similar to those illustrated in FIG. 1 and FIG. 3 were then formed by connecting through metallization processes as are conventional in the art the electrical circuit elements illustrated in FIG. 1 and FIG. 3. As a comparison, a Dynamic Random Access Memory (DRAM) integrated circuit chip was also formed through a conventional process wherein neither the source electrodes nor the drain electrodes of field devices and field effect transistors contained within Electro-Static Discharge (ESD) protection integrated sub-circuits or input/output circuits were masked from ion implant processes employing dopant ions of polarity opposite to those source electrodes and drain electrodes.

The input capacitances of the address input integrated circuits and data input/output integrated circuits within the three Dynamic Random Access Memory (DRAM) chips were then measured using current and voltage measurement techniques as are conventional in the art. The three Dynamic Random Access Memory (DRAM) integrated circuit chips were then subjected to Electro-Static Discharge (ESD) testing to determine susceptibility to Electro-Static Discharge (ESD) conditions due to handling (Human Body Model) of the chips and normal operation (Machine Model) of the chips. The Electro-Static Discharge (ESD) testing measured the tolerance to voltage excursions exhibited by the drain electrodes within integrated circuit devices of the address input and data input/output integrated circuits.

The results of the address input circuit input capacitance measurements and the data input/output circuit input capacitance measurements are reported in TABLE I. The results of the Electro-Static Discharge (ESD) testing are reported in TABLE II.

TABLE I

| EXAMPLE | PROCESS CONDITIONS | CIRCUIT | CAPACITANCE (pF) |
|---|---|---|---|
| 1 | masked drains | address | 3.9 +/− 0.4 |
|   |   | data | 5.6 +/− 0.2 |
| 2 | masked drains | address | 3.9 +/− 0.4 |
|   |   | data | 5.8 +/− 0.1 |
| 3 | no masked drains | address | 5.2 +/− 0.4 |
|   |   | data | 8.7 +/− 0.2 |

TABLE II

| EXAMPLE | PROCESS CONDITIONS | ESD (−VDD, Human/Machine) |
|---|---|---|
| 1 | masked drains | >6000 / >600 volts/volts |
| 2 | masked drains | >6000 / >600 |
| 3 | no masked drains | >6000 / >600 |

From review of the data of TABLE I and TABLE II is clear that the method of the present invention provides an Electro-Static Discharge (ESD) protection integrated sub-circuit within an input/output integrated circuit which has a lower input capacitance in comparison with analogous Electro-Static Discharge (ESD) protection integrated sub-circuits and input/output integrated circuits conventional to the art, while simultaneously maintaining the Electro-Static Discharge (ESD) properties of the Electro-Static Discharge (ESD) integrated sub-circuit within the input/output integrated circuit.

As is understood by a person skilled in the art, the foregoing Preferred Embodiments and Examples of the present invention are illustrative of the present invention rather than limiting of the present invention. Revisions and modifications may be made to methods, materials and process sequences by which are formed the Preferred Embodiments and Examples of the present invention while still forming an Example or Embodiment which is within the spirit and scope of the present invention. For example, revisions may be made to the ordering of the ion implant processes of the present invention while still remaining within the scope of the present invention.

What is claimed is:

1. A method for forming a low capacitance input/output integrated circuit upon a semiconductor substrate comprising:

forming upon a semiconductor substrate an input/output integrated circuit, the input/output integrated circuit having contained therein at least one integrated circuit device, the integrated circuit device having at minimum a source electrode region and a drain electrode region into which are normally implanted dopant ions of polarity opposite to the source electrode and the drain electrode of the integrated circuit device;

masking at least a portion of the drain electrode region of the integrated circuit device; and implanting into areas other than the masked portion of the drain electrode region of the integrated circuit device dopant ions of polarity opposite to the polarity of the source electrode and the drain electrode of the integrated circuit device.

2. The method of claim 1 wherein the input/output integrated circuit is an address input integrated circuit.

3. The method of claim 2 wherein the integrated circuit device is a field device.

4. The method of claim 3 further comprising at least one field effect transistor in addition to the field device within the address input integrated circuit.

5. The method of claim 1 wherein the input/output integrated circuit is a data input/output integrated circuit.

6. The method of claim 5 wherein the integrated circuit device is a field effect transistor.

7. The method of claim 1 wherein the source electrode and the drain electrode of the integrated circuit device are formed through ion implanting arsenic ions into the semiconductor substrate.

8. The method of claim 7 wherein the arsenic ions are implanted at about 1E15 to about 6E15 ions per square centimeter dose and about 30 to about 80 keV ion implantation energy.

9. The method of claim 1 wherein the dopant ions of polarity opposite to the polarity of the source electrode and the drain electrode are chosen from the group of dopant ions consisting of boron ions and boron difluoride ions.

10. The method of claim 9 wherein the dopant ions of polarity opposite to the polarity of the source electrode and the drain electrode are provided through ion implant processes chosen from the group of ion implant processes consisting of threshold voltage ion implant processes, punchthrough ion implant processes and field ion implant processes (ie: channel stop ion implant processes).

11. The method of claim 9 wherein the dopant ions of polarity opposite to the polarity of the source electrode and the drain electrode are provided at about 5E11 to about 8E12 ions per square centimeter total dose and about 50 to about 180 keV ion implantation energy.

* * * * *